United States Patent
Mule'Stagno et al.

(10) Patent No.: US 6,808,781 B2
(45) Date of Patent: Oct. 26, 2004

(54) SILICON WAFERS WITH STABILIZED OXYGEN PRECIPITATE NUCLEATION CENTERS AND PROCESS FOR MAKING THE SAME

(75) Inventors: Luciano Mule'Stagno, St. Louis, MO (US); Jeffrey L. Libbert, O'Fallon, MO (US); Richard J. Phillips, St. Peters, MO (US); Milind Kulkarni, St. Louis, MO (US); Mohsen Banan, Grover, MO (US); Stephen J. Brunkhorst, Chesterfield, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 10/328,481

(22) Filed: Dec. 23, 2002

(65) Prior Publication Data

US 2003/0136961 A1 Jul. 24, 2003

Related U.S. Application Data

(60) Provisional application No. 60/345,178, filed on Dec. 21, 2001.

(51) Int. Cl.[7] ............................ C30B 29/06; C30B 33/02
(52) U.S. Cl. .......................... 428/64.1; 428/446; 117/2; 117/3; 117/932; 423/348
(58) Field of Search ............................ 428/64.1, 446; 117/2, 3, 13, 932

(56) References Cited

U.S. PATENT DOCUMENTS

| | | | |
|---|---|---|---|
| 5,455,193 A | * 10/1995 | Egloff | .................. 438/704 |
| 6,162,708 A | 12/2000 | Tamatsuka et al. | |
| 6,228,164 B1 | 5/2001 | Ammon et al. | |
| 6,236,104 B1 | 5/2001 | Falster | |
| 6,284,384 B1 | 9/2001 | Wilson et al. | |
| 6,306,733 B1 | 10/2001 | Falster et al. | |
| 6,454,852 B2 | * 9/2002 | Dietze et al. | ................. 117/29 |
| 6,641,888 B2 | * 11/2003 | Asayama et al. | ........... 428/64.1 |
| 2001/0030348 A1 | 10/2001 | Falster | |
| 2002/0179006 A1 | * 12/2002 | Borgini et al. | ................. 117/95 |

FOREIGN PATENT DOCUMENTS

| | | |
|---|---|---|
| EP | 0 732 431 A1 | 9/1996 |
| EP | 0 942 078 A1 | 9/1999 |
| JP | 11189493 | 7/1999 |
| JP | 2000044389 A | 2/2000 |
| WO | WO 98/45507 A | 10/1998 |

OTHER PUBLICATIONS

Shimura, F. et al., "Nitrogen Effect on Oxygen Precipitation in Czochralski Silicon" Appl. Phys. Lett 48(3), Jan. 20, 1986, pp. 224–226.

Shimura, F. "Semiconductor Silicon Crystal Technology" Academic Press, Inc., 1989, pp. 116–121; 174–191; 360–380.

Zimmermann, H. et al., "The Modeling of Platinum Diffusion in Silicon under Non–equilibrium Conditions" J. Electrochem. Soc., vol. 139, No. 1, Jan. 1992, pp. 256–262.

Zimmermann, H. et al., "Investigation of the nucleation of oxygen precipitates in Czochralski silicon at an early stage", Appl. Phys. Lett. 60 (26), Jun. 29, 1992, pp. 3250–3252

Zimmermann, H. et al., "Vacancy concentration wafer mapping in silicon" Journal of Crystal Growth 129 (1993), pp. 582–592.

International Search Report date Aug. 11, 2003, International application No. PCT/US02/41269.

* cited by examiner

Primary Examiner—Stephen Stein
(74) Attorney, Agent, or Firm—Senniger Powers

(57) ABSTRACT

A silicon wafer having a controlled oxygen precipitation behavior such that a denuded zone extending inward from the front surface and oxygen precipitates in the wafer bulk sufficient for intrinsic gettering purposes are ultimately formed. Specifically, prior to formation of the oxygen precipitates, the wafer bulk comprises dopant stabilized oxygen precipitate nucleation centers. The dopant is selected from a group consisting of nitrogen and carbon and the concentration of the dopant is sufficient to allow the oxygen precipitate nucleation centers to withstand thermal processing such as an epitaxial deposition process while maintaining the ability to dissolve any grown-in nucleation centers.

48 Claims, 1 Drawing Sheet

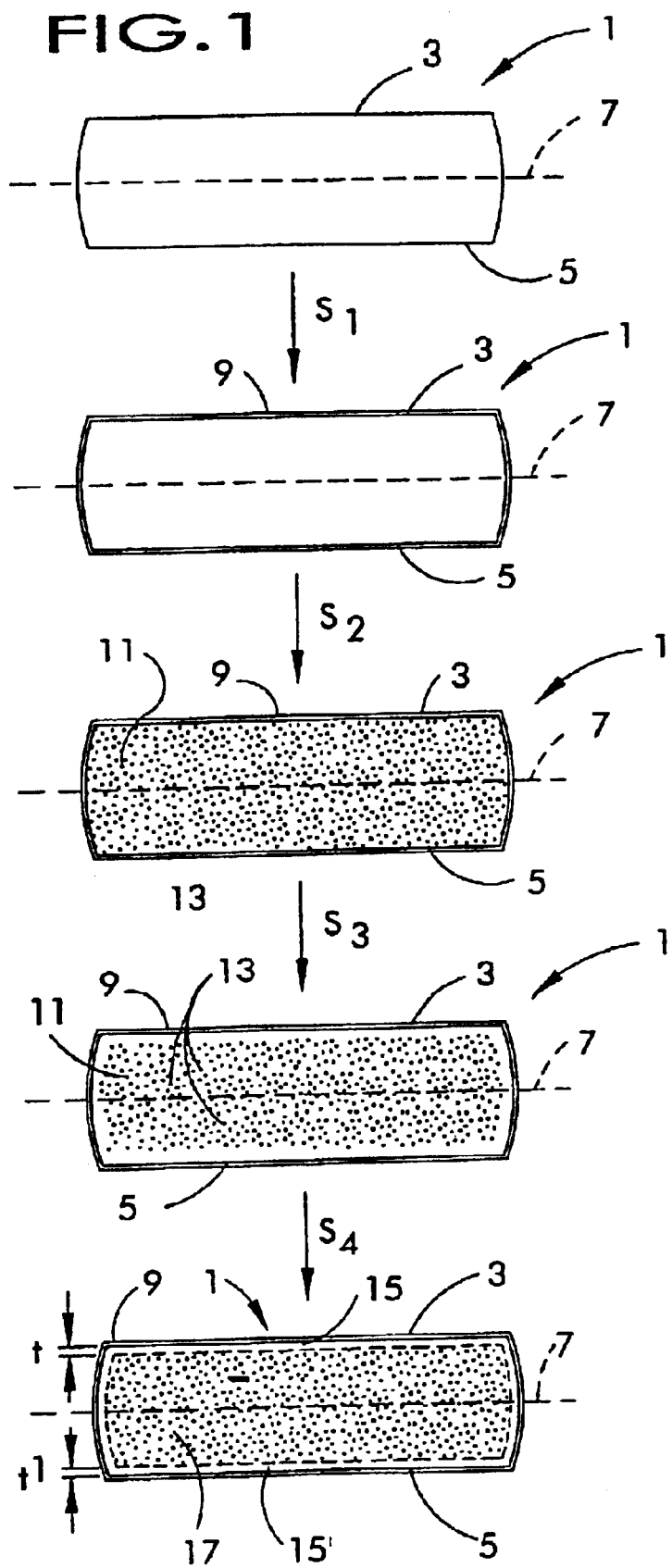

SILICON WAFERS WITH STABILIZED OXYGEN PRECIPITATE NUCLEATION CENTERS AND PROCESS FOR MAKING THE SAME

CROSS-REFERENCE TO RELATED APPLICATION

This application claims the benefit of U.S. Provisional Application No. 60/345,178, filed Dec. 21, 2001.

BACKGROUND OF THE INVENTION

The present invention generally relates to the preparation of semiconductor material substrates, especially silicon wafers, which are used in the manufacture of electronic components. More particularly, the present invention relates to a process for the treatment of silicon wafers which enables the wafers, during the heat treatment cycles of essentially any arbitrary electronic device manufacturing process to form an ideal, non-uniform depth distribution of oxygen precipitates.

Single crystal silicon, which is the starting material for most processes for the fabrication of semiconductor electronic components, is commonly prepared with the so-called Czochralski process wherein a single seed crystal is immersed into molten silicon and then grown by slow extraction. As molten silicon is contained in a quartz crucible, it is contaminated with various impurities, among which is mainly oxygen. At the temperature of the silicon molten mass, oxygen comes into the crystal lattice until it reaches a concentration determined by the solubility of oxygen in silicon at the temperature of the molten mass and by the actual segregation coefficient of oxygen in solidified silicon. Such concentrations are greater than the solubility of oxygen in solid silicon at the temperatures typical for the processes for the fabrication of electronic devices. As the crystal grows from the molten mass and cools, therefore, the solubility of oxygen in it decreases rapidly, whereby in the resulting slices or wafers, oxygen is present in supersaturated concentrations.

Thermal treatment cycles which are typically employed in the fabrication of electronic devices can cause the precipitation of oxygen in silicon wafers which are supersaturated in oxygen. Depending upon their location in the wafer, the precipitates can be harmful or beneficial. Oxygen precipitates located in the active device region of the wafer can impair the operation of the device. Oxygen precipitates located in the bulk of the wafer, however, are capable of trapping undesired metal impurities that may come into contact with the wafer. The use of oxygen precipitates located in the bulk of the wafer to trap metals is commonly referred to as internal or intrinsic gettering ("IG").

Historically, electronic device fabrication processes included a series of steps which were designed to produce silicon having a zone or region near the surface of the wafer which is free of oxygen precipitates (commonly referred to as a "denuded zone" or a "precipitate free zone") with the balance of the wafer, i.e., the wafer bulk, containing a sufficient number of oxygen precipitates for IG purposes. Denuded zones can be formed, for example, in a high-low-high thermal sequence such as (a) oxygen out-diffusion heat treatment at a high temperature (>1100° C.) in an inert ambient for a period of at least about 4 hours, (b) oxygen precipitate nuclei formation at a low temperature (600–750° C.), and (c) growth of oxygen ($SiO_2$) precipitates at a high temperature (1000–1150° C.). See, e.g., F. Shimura, *Semiconductor Silicon Crystal Technology*, Academic Press, Inc., San Diego Calif. (1989) at pages 361–367 and the references cited therein.

More recently, however, advanced electronic device manufacturing processes such as DRAM manufacturing processes have begun to minimize the use of high temperature process steps. Although some of these processes retain enough of the high temperature process steps to produce a denuded zone and sufficient density of bulk precipitates, the tolerances on the material are too tight to render it a commercially viable product. Other current highly advanced electronic device manufacturing processes contain no out-diffusion steps at all. Because of the problems associated with oxygen precipitates in the active device region, therefore, these electronic device fabricators must use silicon wafers which are incapable of forming oxygen precipitates anywhere in the wafer under their process conditions. As a result, all IG potential is lost.

BRIEF SUMMARY OF THE INVENTION

Among the objects of the invention, therefore, is the provision of a single crystal silicon wafer which, during the heat treatment cycles of essentially any electronic device manufacturing process, will form an ideal, non-uniform depth distribution of oxygen precipitates; the provision of such a wafer which will optimally and reproducibly form a denuded zone of sufficient depth and a sufficient density of oxygen precipitates in the wafer bulk; the provision of such wafer in which the formation of the denuded zone and the formation of the oxygen precipitates in the wafer bulk is not dependent upon difference in oxygen concentration in these regions of the wafer; the provision of such a wafer in which the thickness of the resulting denuded zone is essentially independent of the details of the integrated circuit manufacturing process sequence; the provision of such a wafer in which the formation of the denuded zoned and the formation of the oxygen precipitates in the wafer bulk is not influenced by the thermal history and the oxygen concentration of the Czochralski-grown single crystal silicon ingot from which the silicon wafer is sliced; the provision of a process in which the formation of the denuded zone does not depend upon the out-diffusion of oxygen; and the provision of a process in which the silicon is doped with nitrogen and/or carbon at a sufficient concentration to stabilize oxygen precipitate nucleation centers such that they can withstand subsequent rapid thermal processing without preventing the formation of the denuded zone.

Briefly, therefore, the present invention is directed to a single crystal silicon wafer having two major, generally parallel surfaces, one of which is the front surface of the wafer and the other of which is the back surface of the wafer, a central plane between the front and back surfaces, and a circumferential edge joining the front and back surfaces. The wafer also comprises a dopant selected from a group consisting of nitrogen and carbon, the concentration of the dopant being sufficient to promote the formation of stabilized oxygen precipitate nucleation centers as the wafer is cooled from a first temperature, $T_1$, to a second temperature, $T_2$, at a rate, R. The stabilized oxygen precipitation nucleation centers being incapable of are dissolved at a temperature less than about 1150° C. but capable of being dissolved at a temperature between about 1150° C. and about 1300° C., $T_1$ is between about 1150° C. and about 1300° C., $T_2$ is a temperature at which crystal lattice vacancies are relatively immobile in silicon, and R is at least about 5° C. per second. Still further, the wafer comprises a surface layer which comprises the region of the wafer between the front surface and a distance, D, measured from the front surface and toward the central plane, wherein the surface layer is free of stabilized oxygen precipitate nucleation centers. Also, the wafer comprises a bulk layer which comprises a second region of the wafer between the central plane and the surface layer, wherein the bulk layer comprises stabilized oxygen precipitate nucleation centers.

The present invention is also directed to a single crystal silicon wafer having two major, generally parallel surfaces, one of which is the front surface of the wafer and the other of which is the back surface of the wafer, a central plane between the front and back surfaces, and a circumferential edge joining the front and back surfaces. The wafer comprises a dopant selected from a group consisting of nitrogen and carbon, when nitrogen is the dopant, the the concentration of the nitrogen is between about $1 \times 10^{12}$ and about $5 \times 10^{14}$ atoms/cm$^3$, and when carbon is the dopant, the concentration of carbon is between about $1 \times 10^{16}$ and about $4 \times 10^{17}$ atoms/cm$^3$. The wafer also comprises a surface layer that comprises the region of the wafer between the front surface and a distance, D, measured from the front surface and toward the central plane, wherein the surface layer is free of stabilized oxygen precipitate nucleation centers. Additionally, the wafer comprises a bulk layer that comprises a second region of the wafer between the central plane and the surface layer, wherein the bulk layer comprises stabilized oxygen precipitate nucleation centers.

In yet another embodiment, the present invention is directed to a silicon on insulator structure comprising single crystal handle wafer, a single crystal silicon device layer, and an insulating layer between the handle wafer and the device layer. The single crystal silicon handle wafer comprises two major, generally parallel surfaces, one of which is the front surface of the wafer and the other of which is the back surface of the wafer, a central plane between the front and back surfaces, and a circumferential edge joining the front and back surfaces. The handle wafer also comprises a dopant selected from a group consisting of nitrogen and carbon, the concentration of the dopant being sufficient to promote the formation of stabilized oxygen precipitate nucleation centers as the wafer is cooled from a first temperature, $T_1$, to a second temperature, $T_2$, at a rate, R. The stabilized oxygen precipitation nucleation centers are incapable of being dissolved at a temperature less than about 1150° C. but capable of being dissolved at a temperature between about 1150° C. and about 1300° C., $T_1$ is between about 1150° C. and about 1300° C., $T_2$ is a temperature at which crystal lattice vacancies are relatively immobile in silicon, and R is at least about 5° C. per second. The handle wafer further comprises a surface layer which comprises the region of the wafer between the front surface and a distance, D, measured from the front surface and toward the central plane, wherein the surface layer is free of stabilized oxygen precipitate nucleation centers. Also, the handle wafer comprises a bulk layer which comprises a second region of the wafer between the central plane and the surface layer, wherein the bulk layer comprises stabilized oxygen precipitate nucleation centers.

The present invention is further directed to a process for the preparation of a single crystal silicon wafer having a controlled oxygen precipitation behavior. The process comprises selecting a wafer sliced from a single crystal silicon ingot grown by the Czochralski method and comprises a front surface, a back surface, a central plane between the front and back surfaces, a front surface layer which comprises the region of the wafer between the front surface and a distance, D, measured from the front surface and toward the central plane, a bulk layer which comprises the region of the wafer between the central plane and the front surface layer. The wafer also comprises a dopant selected from a group consisting of nitrogen and carbon, the concentration of the dopant being sufficient to promote the formation of stabilized oxygen precipitate nucleation centers as the wafer is cooled from a first temperature, $T_1$, to a second temperature, $T_2$, at a rate, R. The stabilized oxygen precipitation nucleation centers are incapable of being dissolved at a temperature less than about 1150° C. but capable of being dissolved at a temperature between about 1150° C. and about 1300° C., $T_1$ is between about 1150° C. and about 1300° C., $T_2$ is a temperature at which crystal lattice vacancies are relatively immobile in silicon, and R is at least about 5° C. per second. The process comprises heating the wafer to a temperature of at least about 1150° C. to form crystal lattice vacancies in the front surface and bulk layers and cooling the heated wafer at a rate to form a vacancy concentration profile in the wafer wherein the peak density of vacancies is in the bulk layer with the concentration generally decreasing from the location of the peak density in the direction of the front surface of the wafer and the difference in the concentration of vacancies in the front surface and bulk layers is such that stabilized oxygen precipitate nucleation centers do not form in the front surface layer and stabilized oxygen precipitate nucleation centers form in the bulk layer. Also, the process comprises forming stabilized oxygen precipitate nucleation centers in the bulk layer as the wafer is being cooled with the concentration of the stabilized oxygen precipitate nucleation centers in the bulk layer being primarily dependant upon the concentration of vacancies.

In yet another embodiment, the present invention is directed to a process for the preparation of a single crystal silicon wafer having a controlled oxygen precipitation behavior. The process comprises selecting a wafer is sliced from a single crystal silicon ingot grown by the Czochralski method comprising a front surface, a back surface, a central plane between the front and back surfaces, a front surface layer which comprises the region of the wafer between the front surface and a distance, D, measured from the front surface and toward the central plane, a bulk layer which comprises the region of the wafer between the central plane and the front surface layer. The wafer also comprises a dopant selected from the group consisting of nitrogen and carbon, when nitrogen is the dopant, the concentration of the nitrogen is between about $1 \times 10^{12}$ and about $5 \times 10^{14}$ atoms/cm$^3$, and when carbon is the dopant, the concentration of carbon is between about $1 \times 10^{16}$ and about $4 \times 10^{17}$ atoms/cm$^3$. The process also comprises subjecting the wafer to a heat-treatment to form crystal lattice vacancies in the front surface and bulk layers. The heated-treated wafer is cooled at a rate that produces a vacancy concentration profile in the wafer wherein the peak density of vacancies is in the bulk layer with the concentration generally decreasing from the location of the peak density in the direction of the front surface of the wafer and the difference in the concentration of vacancies in the front surface and bulk layers is such that stabilized oxygen precipitate nucleation centers do not form in the front surface layer and stabilized oxygen precipitate nucleation centers form in the bulk layer. Additionally, as the heat-treated wafer is cooled, stabilized oxygen precipitate nucleation centers are formed in the bulk layer with the concentration of the stabilized oxygen precipitate nucleation centers in the bulk layer being primarily dependant upon the concentration of vacancies.

Other objects and features of this invention will be in part apparent and in part pointed out hereinafter.

BRIEF DESCRIPTION OF THE DRAWINGS

FIG. 1 is a schematic depiction of the process of the present invention.

DETAILED DESCRIPTION OF THE PREFERRED EMBODIMENTS

In accordance with the present invention, an ideal precipitating wafer has been discovered which, during essentially any electronic device manufacturing process, will form a denuded zone of sufficient depth and a wafer bulk containing a sufficient density of oxygen precipitates for IG purposes. Advantageously, this ideal precipitating wafer may be prepared in a matter of minutes using tools which are in common use in the semiconductor silicon manufacturing industry. This process creates a "template" in the silicon which determines or "prints" the manner in which oxygen will ultimately precipitate. In accordance with the present invention, this template is stabilized such that it may survive a subsequent rapid thermal heat treatment (e.g., epitaxial deposition and/or oxygen implantation) without an intervening thermal stabilization anneal.

A. Starting Material

The starting material for the ideal precipitating wafer of the present invention is a single crystal silicon wafer comprising nitrogen and/or carbon as a dopant. The concentration of the dopant is selected to accommodate two opposing desirable characteristics: (i) the ability to dissolve any oxygen precipitation nucleation centers in the starting wafer so that oxygen ultimately precipitates according to the ideal template (i.e., a denuded zone free of oxygen precipitates and an intrinsic gettering region in the wafer bulk comprising oxygen precipitates); and (ii) the ability to grow oxygen precipitate nucleation centers that are sufficiently large, or stable, during the process of the present invention such that the nucleation centers will not dissolve during a subsequent rapid thermal treatment such as epitaxial deposition and erase the installed precipitate template. To realize the stabilizing benefit while maintaining the ability to form a denuded zone, the concentration of dopant in the silicon is typically between about $1\times10^{12}$ atoms/cm$^3$ (about 0.00002 ppma) and $1\times10^{15}$ atoms/cm$^3$ (about 0.02 ppma). In another embodiment of the present invention, the concentration of nitrogen is between about $1\times10^{12}$ atoms/cm$^3$ and about $1\times10^{13}$ atoms/cm$^3$ (0.0002 ppma). If the concentration of the nitrogen is too low, e.g., less than about $1\times10^{12}$ atoms/cm$^3$ (about 0.00002 ppma), the stabilizing effect may not be realized (i.e., they may be dissolved at a temperature less than about 1150° C.). On the other hand, if the concentration of nitrogen is too high, e.g., greater than about $1\times10^{15}$ atoms/cm$^3$ (about 0.02 ppma), the oxygen precipitation nucleation centers formed during the growth of the crystal may not be dissolved during the rapid thermal annealing step of the process of the present invention.

Additionally, if the silicon crystal contains too much nitrogen, oxidation induced stacking faults (OISF) will tend to form throughout the wafer which negatively impacts the quality of the wafer and any epitaxial layer deposited thereon (see Japanese Patent Office Publication Number 1999-189493). Specifically, OISF on the surface of a silicon wafer, unlike other vacancy-type defects, are not covered by the deposition of an epitaxial silicon layer. OISF continue to grow through the epitaxial layer and result in grown-in defects commonly referred to as epitaxial stacking faults. Epitaxial stacking faults have a maximum cross-sectional width ranging from the current detection limit of a laser-based auto-inspection device of about 0.1 μm to greater than about 10 μm.

In accordance with the present invention, wafer may comprise carbon instead of, or in conjunction with, nitrogen in order to stabilize the oxygen precipitate nucleation centers. In one embodiment, the concentration of carbon in the ingot is between about $1\times10^{16}$ atoms/cm$^3$ (0.2 ppma) and about $4\times10^{17}$ atoms/cm$^3$ (8 ppma). In another embodiment the concentration of carbon is between about $1.5\times10^{16}$ atoms/cm$^3$ (0.3 ppma) and about $3\times10^{17}$ atoms/cm$^3$ (6 ppma).

Czochralski-grown silicon typically has an interstitial oxygen concentration within the range of about $5\times10^{17}$ to about $9\times10^{17}$ atoms/cm$^3$ (ASTM standard F-121-83). Because the oxygen precipitation behavior of the wafer becomes essentially decoupled from the oxygen concentration in the ideal precipitating wafer, the starting wafer may have an oxygen concentration falling anywhere within or even outside the range attainable by the Czochralski process.

During the growth of a silicon single crystal ingot having no more than a typical impurity level of nitrogen and/or carbon, the silicon is cooled from its melting temperature (about 1410° C.) and as the silicon cools through the temperature range of about 700° C. to about 350° C., vacancies and oxygen can interact to form oxygen precipitate nucleation centers in the ingot. Without being held to a particular theory, it is presently believed that the nitrogen/carbon dopant atoms promote the formation of oxygen precipitate nucleation centers by retarding the diffusion of the vacancies in single crystal silicon. Specifically, as the concentration of nitrogen and/or carbon is increased above the impurity level, the decreasing diffusion rate of the vacancies increases the temperature at which the critical supersaturation of vacancies and oxygen occurs. For example, the critical supersaturation temperature for silicon having a concentration of nitrogen and/or carbon within the range as set forth above is shifted to between about 800° C. and about 1050° C. At the higher critical supersaturation temperature the concentration of vacancies is greater and the oxygen atoms are more mobile which allows for increased interaction between the two. Additionally, raising the critical supersaturation temperature for a comparable ingot growth process, allows the silicon to reside within the temperature range that oxygen precipitate nucleation centers form and grow for longer period of time. These factors result in the formation of larger, more stable, oxygen precipitate nucleation centers.

In accordance with the present invention, the presence or absence of nucleation centers in the starting material is not critical because they are capable of being dissolved by heat-treating the silicon at a temperature between about 1150° C. and about 1300° C. Although the presence (or density) of oxygen precipitation nucleation centers cannot be directly measured using presently available techniques, their presence may be detected by subjecting the silicon wafer to an oxygen precipitation heat treatment such as annealing the wafer at a temperature of 800° C. for four hours and then at a temperature of 1000° C. for sixteen hours. The detection limit for oxygen precipitates is currently about $5\times10^{16}$ precipitates/cm$^3$.

The wafer is sliced from an ingot grown in accordance with conventional Czochralski crystal growing method. During the growth of the ingot, nitrogen and/or carbon may be introduced into the ingot by several methods including, for example, gaseous nitrogen/carbon into the growth chamber and/or adding solid nitrogen/carbon to the polysilicon melt. The amount of dopant being added to the growing crystal is more precisely controlled by adding the solid dopant to the polysilicon melt, as such, it is typically used. For example, the amount of nitrogen/carbon added to the crystal is readily determined, for example, by depositing a layer of silicon nitride ($Si_3N_4$) or silicon carbide (SiC) of a known thickness on silicon wafers of a known diameter which are introduced into the crucible with the polysilicon prior to forming the silicon melt (the densities of $Si_3N_4$ and SiC are about 3.18 g/cm$^3$ and about 3.21 g/cm$^3$, respectively).

Standard Czochralski growth methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference). The starting material for the process of the present invention may be a polished silicon wafer, or alternatively, a silicon wafer which has been lapped and etched but not polished. In addition, the wafer may have vacancy or self-interstitial point defects as the predominant intrinsic point defect. For example, the wafer may be vacancy dominated from center to edge, self-interstitial dominated from center to edge, or it may contain a central core of vacancy of dominated material surrounded by an axially symmetric ring of self-interstitial dominated material. processing methods.

Referring now to FIG. 1, the starting material for the ideal precipitating wafer of the present invention, single crystal silicon wafer 1, has a front surface 3, a back surface 5, and an imaginary central plane 7 between the front and back surfaces. The terms "front" and "back" in this context are used to distinguish the two major, generally planar surfaces of the wafer; the front surface of the wafer as that term is used herein is not necessarily the surface onto which an electronic device will subsequently be fabricated nor is the back surface of the wafer as that term is used herein necessarily the major surface of the wafer which is opposite the surface onto which the electronic device is fabricated. In addition, because silicon wafers typically have some total thickness variation (TTV), warp and bow, the midpoint between every point on the front surface and every point on the back surface may not precisely fall within a plane; as a practical matter, however, the TTV, warp and bow are typically so slight that to a close approximation the midpoints can be said to fall within an imaginary central plane which is approximately equidistant between the front and back surfaces.

B. Vacancy Formation in the Doped Silicon Wafer

In accordance with the present invention, the wafer is subjected to a heat-treatment step, step $S_2$ (optional step $S_1$ is described in greater detail below), in which the wafer is heated to an elevated temperature to form and thereby increase the number density of crystal lattice vacancies 13 in wafer 1. Preferably, this heat-treatment step is carried out in a rapid thermal annealer in which the wafers are rapidly heated to a target temperature, $T_1$, and annealed at that temperature for a relatively short period of time (e.g., they are capable of heating a wafer from room temperature to 1200° C. in a few seconds). One such commercially available RTA furnace is the model 2800 furnace available from STEAG AST Electronic GmbH (Dornstadt, Germany). In general, the wafer is subjected to a temperature in excess of 1150° C. Typically, the wafer is heated to a temperature between about 1200 and about 1275° C., and more typically between about 1225 and 1250° C.

Intrinsic point defects (vacancies and silicon self-interstitials) are capable of diffusing through single crystal silicon with the rate of diffusion being temperature dependant. The concentration profile of intrinsic point defects, therefore, is a function of the diffusivity of the intrinsic point defects and the recombination rate as a function of temperature. For example, the intrinsic point defects are relatively mobile at temperatures in the vicinity of the temperature at which the wafer is annealed in the rapid thermal annealing step whereas they are essentially immobile for any commercially practical time period at temperatures of as much as 700° C. Experimental evidence obtained to-date suggests that the effective diffusion rate of vacancies slows considerably at temperatures less than about 700° C. and perhaps as great as 800° C., 900° C., or even 1,000° C., the vacancies can be considered to be immobile for any commercially practical time period.

In addition to causing the formation of crystal lattice vacancies, the rapid thermal annealing step causes the dissolution of pre-existing oxygen precipitate nucleation centers which are present in the silicon starting material. These nucleation centers may be formed, for example, during the growth of the single crystal silicon ingot from which the wafer was sliced, or as a consequence of some other event in the previous thermal history of the wafer or of the ingot from which the wafer is sliced. Thus, the presence or absence of these nucleation centers in the starting material is not critical, provided these centers are capable of being dissolved during the rapid thermal annealing step.

During the heat-treatment, the wafer is exposed to an atmosphere comprising a gas or gasses selected to produce a vacancy concentration profile which, in one embodiment is relatively uniform and which, in another embodiment, is non-uniform.

1. Non-nitriding and Non-oxidizing Atmosphere Embodiment

In a one embodiment, the wafer 1 is heat-treated in a non-nitriding atmosphere and non-oxidizing atmosphere (i.e., an inert atmosphere). When a non-nitrogen, non-oxygen-containing gas is used as the atmosphere or ambient in the rapid thermal annealing step and cooling step, the increase in vacancy concentration throughout the wafer is achieved nearly, if not immediately, upon achieving the annealing temperature. The profile of the resulting vacancy concentration (number density) in the wafer during the heat-treatment is relatively constant from the front of the wafer to the back of the wafer. The wafer will generally be maintained at this temperature for at least one second, typically for at least several seconds (e.g., at least 3 seconds), preferably for several tens of seconds (e.g., 20, 30, 40, or 50 seconds) and, depending upon the desired characteristics of the wafer, for a period which may range up to about 60 seconds (which is near the limit for commercially available rapid thermal annealers). Maintaining the wafer at an established temperature during the anneal for additional time does not appear, based upon experimental evidence obtained to-date, to lead to an increase in vacancy concentration. Suitable gases include argon, helium, neon, carbon dioxide, and other such inert elemental and compound gasses, or mixtures of such gasses.

Experimental evidence obtained to-date suggests that the non-nitriding/non-oxidizing atmosphere preferably has no more than a relatively small partial pressure of oxygen, water vapor and other oxidizing gases; that is, the atmosphere has a total absence of oxidizing gases or a partial pressure of such gases which is insufficient to inject sufficient quantities of silicon self-interstitial atoms which suppress the build-up of vacancy concentrations. While the lower limit of oxidizing gas concentration has not been precisely determined, it has been demonstrated that for partial pressures of oxygen of 0.01 atmospheres (atm.), or 10,000 parts per million atomic (ppma), no increase in vacancy concentration and no effect is observed. Thus, it is preferred that the atmosphere have a partial pressure of oxygen and other oxidizing gases of less than 0.01 atm.

(10,000 ppma); more preferably the partial pressure of these gases in the atmosphere is no more than about 0.005 atm. (5,000 ppma), more preferably no more than about 0.002 atm. (2,000 ppma), and most preferably no more than about 0.001 atm. (1,000 ppma).

2. Superficial Oxide Layer/Nitriding Atmosphere Embodiment

In another embodiment of the process of the present invention, the wafer 1 is heat-treated in an oxygen-containing atmosphere in step $S_1$ to grow a superficial oxide layer 9 which envelopes wafer 1 prior to step $S_2$. In general, the oxide layer will have a thickness which is greater than the native oxide layer which forms upon silicon (about 15 Å). In this second embodiment, the thickness of the oxide layer is typically at least about 20 Å. In some instances, the wafer will have an oxide layer that is at least about 25 or 30 Å thick. Experimental evidence obtained to-date, however, suggests that oxide layers having a thickness greater than about 30 Å, while not interfering with the desired effect, provide little or no additional benefit.

After forming the oxide layer, the rapid thermal annealing step is typically carried out in the presence of a nitriding atmosphere, that is, an atmosphere containing nitrogen gas ($N_2$) or a nitrogen-containing compound gas such as ammonia which is capable of nitriding an exposed silicon surface. Alternatively, or in addition, the atmosphere may comprise a non-oxidizing and non-nitriding gas such as argon. An increase in vacancy concentration throughout the wafer is achieved nearly, if not immediately, upon achieving the annealing temperature and vacancy concentration profile in the wafer is relatively uniform.

3. Native Oxide Layer/Nitriding Atmosphere Embodiment

In a third embodiment, the starting wafer has no more than a native oxide layer. When such a wafer is annealed in a nitriding atmosphere, the effect differs from that which is observed for the second embodiment. Specifically, when the wafer having an enhanced oxide layer is annealed in a nitrogen atmosphere a substantially uniform increase in the vacancy concentration is achieved throughout the wafer nearly, if not immediately, upon reaching the annealing temperature; furthermore, the vacancy concentration does not appear to significantly increase as a function of annealing time at a given annealing temperature. If the wafer lacks anything more than a native oxide layer and if the front and back surfaces of the wafer are annealed in nitrogen, the resulting wafer will have a vacancy concentration (number density) profile which is generally "U-shaped" for a cross-section of the wafer. That is, a maximum concentration of vacancies will occur at or within several micrometers of the front and back surfaces and a relatively constant and lesser concentration will occur throughout the wafer bulk with the minimum concentration in the wafer bulk initially being approximately equal to the concentration which is obtained in wafers having an enhanced oxide layer. Furthermore, an increase in annealing time will result in an increase in vacancy concentration in wafers lacking anything more than a native oxide layer.

Accordingly, referring again to FIG. 1, when a segment having only a native oxide layer is annealed in accordance with the present process under a nitriding atmosphere, the resulting peak concentration, or maximum concentration, of vacancies will initially be located generally within regions 15 and 15', while the bulk 17 of the silicon segment will contain a comparatively lower concentration of vacancies and nucleation centers. Typically, these regions of peak concentration will be located within several microns (i.e., about 5 or 10 microns), or tens of microns (i.e., about 20 or 30 microns), up to about 40 to about 60 microns, from the silicon segment surface.

4. Oxygen-containing Ambient

When the atmosphere or ambient in the rapid thermal annealing and cooling steps contains oxygen, or more specifically when it comprises oxygen gas ($O_2$) or an oxygen-containing gas (e.g., pyrogenic steam) in combination with a nitrogen-containing gas, an inert gas or both, the vacancy concentration profile in the near surface region is affected. Experimental evidence to-date indicates that the vacancy concentration profile of a near-surface region bears an inverse relationship with atmospheric oxygen concentration. Without being bound to any particular theory, it is generally believed that, in sufficient concentration, annealing in oxygen results in the oxidation of the silicon surface and, as a result, acts to create an inward flux of silicon self-interstitials. The flux of silicon interstitials is controlled by the rate of oxidation which, in turn, can be controlled by the partial pressure of oxygen in the ambient. This inward flux of self-interstitials has the effect of gradually altering the vacancy concentration profile by causing recombinations to occur, beginning at the surface and then moving inward, with the rate of inward movement increasing as a function of increasing oxygen partial pressure. When oxygen is used in combination with a nitrogen-containing gas in the ambient during heat-treatment ($S_1$ and/or $S_2$), a "M-shaped" vacancy profile may be obtained, wherein the maximum or peak vacancy concentration is present in the wafer bulk between the central plane and a surface layer (the concentration generally decreasing in either direction). As a result of the presence of oxygen in the ambient, a region of low vacancy concentration of any arbitrary depth may be created.

Further, experimental evidence further suggests that the difference in behavior for wafers having no more than a native oxide layer and wafers having an enhanced oxide layer can be avoided by including molecular oxygen or another oxidizing gas in the atmosphere. Stated another way, when wafers having no more than a native oxide are annealed in a nitrogen atmosphere containing a small partial pressure of oxygen, the wafer behaves the same as wafers having an enhanced oxide layer (i.e., a relatively uniform concentration profile is formed in the heat-treated wafer). Without being bound to any theory, it appears that superficial oxide layers which are greater in thickness than a native oxide layer serve as a shield which inhibits nitridization of the silicon. This oxide layer may thus be present on the starting wafer or formed, in situ, by growing an enhanced oxide layer during the annealing step. If this is desired, the atmosphere during the rapid thermal annealing step preferably contains a partial pressure of at least about 0.0001 atm. (100 ppma), more preferably a partial pressure of at least about 0.0002 atm. (200 ppma). For the reasons previously discussed, however, the partial pressure of oxygen preferably does not exceed 0.01 atm. (10,000 ppma), and is more preferably less than 0.005 atm. (5,000 ppma), still more preferably less than 0.002 atm. (2,000 ppma), and most preferably less than 0.001 atm. (1,000 ppma).

In a fourth embodiment, therefore, the atmosphere during the rapid thermal annealing typically contains an oxygen partial pressure sufficient to obtain a denuded zone depth of less than about 30 microns. Typically the denuded zone depth ranges from greater than about 5 microns to less than about 30 microns, and can range from about 10 microns to about 25 microns, or from about 15 microns to about 20 microns. More specifically, the thermal treatment may be carried out in an atmosphere comprising a nitrogen-containing gas (e.g., $N_2$), a non-oxygen, non-nitrogen containing gas (e.g., argon, helium, etc.), or a mixture thereof, and an oxygen-containing gas (e.g., $O_2$ or pyrogenic steam), the atmosphere having an oxygen partial pressure sufficient to create an inward flux of interstitials (e.g., at least about 1 ppma, 5 ppma, 10 ppma or more) but less than about 500 ppma, preferably less than about 400 ppma, 300 ppma, 200 ppma, 150 ppma or even 100 ppma, and in some embodiments preferably less than about 50, 40, 30, 20 or even 10 ppma. When a mixture of a nitrogen-containing and a non-nitrogen, non-oxygen containing gas is used with the oxidizing gas, the respective ratio of the two (i.e., nitrogen-containing to inert gas) may range from about 1:10 to about 10:1, from about 1:5 to about 5:1, from about 1:4 to about 4:1, from about 1:3 to about 3:1, or from about 1:2 to about 2:1, with a ratio of nitrogen-containing gas to inert gas of about 1:5, 1:4, 1:3, 1:2 or 1:1 being preferred in some embodiments. Stated another way, if such a gaseous mixture is used as the atmosphere for the annealing and cooling steps, the concentration of nitrogen-containing gas therein may range from about 1% to less than about 100%, from about 10% to about 90%, from about 20% to about 80% or from about 40% to about 60%.

5. Simultaneous Exposure to Different Atmospheres

In other embodiments of the present invention, the front and back surfaces of the wafer may be exposed to different atmospheres, each of which may contain one or more nitriding or non-nitriding gases. For example, the back surface of the wafer may be exposed to a nitriding atmosphere as the front surface is exposed to a non-nitriding atmosphere. Wafers subjected to a thermal treatment having different atmospheres may have an asymmetric vacancy concentration profile depending on the condition of each surface and the atmosphere to which it is exposed. For example, if the front surface lacks anything more than a native oxide layer and the back surface has an enhanced oxide layer and the wafer is thermally treated in a nitriding atmosphere, the vacancy concentration in the front portion of the wafer will be more similar to the "U-shaped" profile while the back portion of the wafer will be more uniform in nature. Alternatively, multiple wafers (e.g., 2, 3 or more wafers) may be simultaneously annealed while being stacked in face-to-face arrangement; when annealed in this manner, the faces which are in face-to-face contact are mechanically shielded from the atmosphere during the annealing. Alternatively, and depending upon the atmosphere employed during the rapid thermal annealing step and the desired oxygen precipitation profile of the wafer, the oxide layer may be formed only upon one surface of the wafer (e.g., the front surface 3).

C. Rapid Cooling of the Heat-treated Doped Silicon Wafer

Upon completion of step $S_2$, the wafer is rapidly cooled in step $S_3$ through the range of temperatures at which crystal lattice vacancies are relatively mobile in the single crystal silicon to at least the temperature, $T_2$, at which crystal lattice vacancies are relatively immobile in silicon. As the temperature of the wafer is decreased through this range of temperatures, the vacancies diffuse to the surface of the wafer and/or the native oxide layer on the wafer surface and become annihilated, thus leading to a change in the vacancy concentration profile with the extent of change depending upon the length of time the wafer is maintained at a temperature within this range. If the wafer were held at this temperature within this range for an infinite period of time, the vacancy concentration profile would once again become similar to the initial profile of step $S_2$ (e.g., uniform, "U-shaped" or asymmetric) but the equilibrium concentration would be less than the concentration immediately upon completion of the heat treatment step. By rapidly cooling the wafer, however, the distribution of crystal lattice vacancies in the near-surface region is significantly reduced which results in a modified vacancy concentration profile. For example, rapidly cooling a wafer initially having a uniform profile results in a non-uniform profile in which the maximum vacancy concentration is at or near central plane 7 and the vacancy concentration decreases in the direction of the front surface 3 and back surface 5 of the wafer. If the vacancy concentration profile prior to cooling is "U-shaped," the final concentration profile after rapidly cooling the wafer will be "M-shaped." That is, the vacancy concentration profile will have a local minimum concentration near the central plane similar to the U-shaped profile prior to rapidly cooling the wafer, and two local maximum concentrations, one between the central plane and the front surface and one between the central plane and the back surface caused by the suppression of vacancies in the surface regions. Finally, if the vacancy concentration profile prior to cooling is asymmetric, the final concentration will have a local maximum between the central plane and one surface, similar to the "M-shaped" profile and will generally decrease from the central plane to the other surface similar to the profile formed after cooling a uniform concentration profile.

In general, the average cooling rate, R, within this range of temperatures is at least about 5° C. per second and preferably at least about 20° C. per second. Depending upon the desired depth of the denuded zone, the average cooling rate may preferably be at least about 50° C. per second, still more preferably at least about 100° C. per second, with cooling rates in the range of about 100° C. to about 200° C. per second being presently preferred for some applications. Once the wafer is cooled to a temperature outside the range of temperatures at which crystal lattice vacancies are relatively mobile in the single crystal silicon, the cooling rate does not appear to significantly influence the precipitating characteristics of the wafer and thus, does not appear to be narrowly critical. Conveniently, the cooling step may be carried out in the same atmosphere in which the heating step is carried out.

During step $S_3$, the vacancies and interstitial oxygen in the wafer interact to form oxygen precipitate nucleation centers. The concentration of the oxygen precipitate nucleation centers depends primarily upon the vacancy concentration, and as such, the profile of the oxygen precipitate nucleation centers corresponds to that of the vacancies. Specifically, in the high vacancy regions (the wafer bulk), oxygen precipitate nucleation centers are formed and in the low vacancy regions (near the wafer surfaces) oxygen precipitation nucleation centers are not formed. Thus, by dividing the wafer into various zones of vacancy concentration, a template of oxygen precipitation nucleation centers is created. Additionally, the distribution of oxygen precipitate nucleation centers in the wafer bulk corresponds to that of the vacancies. That is, it is non-uniform and may have profiles which may be characterized as, e.g., having a maximum concentration at or near central plane and decreasing in the direction of the front and back surfaces, "M-shaped," or asymmetric.

In accordance with the present invention, the oxygen precipitate nucleation centers formed in the wafer bulk are "stabilized" upon completion of the rapid thermal anneal; that is, a subsequent long term (e.g., hours) thermal heat treatment to grow the nucleation centers to a size that can withstand a rapid thermal treatment such as epitaxial deposition is not needed. As described above, it is presently believed that the nitrogen and/or carbon dopant atoms retard the diffusion of vacancies in the silicon which increases the temperature at which the critical supersaturation of vacancies occurs ultimately resulting in stabilized oxygen precipitate nucleation centers (i.e., they are incapable of being dissolved at a temperature less than about 1150° C.).

After step $S_3$, the wafer has a surface layer which comprises the region of the wafer between the front surface and a distance, D, measured from the front surface and toward the central plane, wherein the surface layer is free of oxygen precipitate nucleation centers and a bulk layer which comprises a second region of the wafer between the central plane and the first region, wherein the bulk layer comprises stabilized oxygen precipitate nucleation centers. The concentration of dopant in the wafer allows the stabilized oxygen precipitate nucleation centers to be dissolved at temperatures in excess of about 1300° C., but not at temperatures less than about 1150° C. As such, the stabilized oxygen precipitation nucleation centers can withstand a subsequent thermal process such as epitaxial deposition without preventing the dissolution of grown-in oxygen precipitate nucleation centers during step $S_2$.

D. Growth of Oxygen Precipitates

In step $S_4$, the wafer is subjected to an oxygen precipitate growth heat-treatment to grow the stabilized oxygen precipitation nucleation centers into oxygen precipitates. For example, the wafer may be annealed at a temperature of 800–1000° C. for sixteen hours. Alternatively and preferably, the wafer is loaded into a furnace which 800–1000° C. as the first step of an electronic device manufacturing process. As the temperature is increased to 800° C. or higher, the oxygen precipitation nucleation clusters continue to grow into precipitates by consuming vacancies and interstitial oxygen, whereas in the region near the surface(s) where oxygen precipitation nucleation centers were not formed and nothing happens.

As illustrated in FIG. 1, the resulting depth distribution of oxygen precipitates in the wafer is characterized by clear regions of oxygen precipitate-free material (denuded zones) 15 and 15' extending from the front surface 3 and back surface 5 to a depth t, t', respectively. Between the oxygen precipitate-free regions, 15 and 15', there is a region 17 which contains a concentration profile of oxygen precipitates that is non-uniform having a profile that depends upon the profile of the vacancies as described above.

The concentration of oxygen precipitates in region 17 is primarily a function of the heating step and secondarily a function of the cooling rate. In general, the concentration of oxygen precipitates increases with increasing temperature and increasing annealing times in the heating step, with precipitate densities in the range of about $1 \times 10^7$ to about $5 \times 10^{10}$ precipitates/cm$^3$ being routinely obtained.

The depth t, t' from the front and back surfaces, respectively, of oxygen precipitate-free material (denuded zones) 15 and 15' is primarily a function of the cooling rate through the temperature range at which crystal lattice vacancies are relatively mobile in silicon. In general, the depth t, t' increases with decreasing cooling rates, with denuded zone depths of at least about 10, 20, 30, 40, 50, 70 or even 100 micrometers being attainable. Significantly, the depth of the denuded zone is essentially independent of the details of the electronic device manufacturing process and, in addition, does not depend upon the out-diffusion of oxygen as is conventionally practiced. As a practical matter, however, the cooling rate required to obtain shallow denuded zone depths are somewhat extreme and the thermal shock may create a risk of shattering the wafer. Alternatively, therefore, the thickness of the denuded zone may be controlled by selection of the ambient in which the wafer is annealed (see, supra) while allowing the wafer to cool at a less extreme rate. Stated another way, for a given cooling rate, an ambient may be selected which creates a template for a deep denuded zone (e.g., 50+ microns), intermediate denuded zones (e.g., 30–50 microns), shallow denuded zones (e.g., less than about 30 microns), or even no denuded zone. In this regard to the precise conditions for the annealing and cooling steps it is to be noted that they may be other than herein described without departing from the scope of the present invention. Furthermore, such conditions may be determined, for example, empirically by adjusting the temperature and duration of the anneal, and the atmospheric conditions (i.e., the composition of the atmosphere, as well as the oxygen partial pressure) in order to optimize the desired depth of t and/or t'.

While the rapid thermal treatments employed in this process of the present invention may result in the out-diffusion of a small amount of oxygen from the surface of the front and back surfaces of the wafer, the amount of out-diffusion is significantly less than what is observed in conventional processes for the formation of denuded zones. As a result, the ideal precipitating wafers of the present invention have a substantially uniform interstitial oxygen concentration as a function of distance from the silicon surface. For example, prior to the oxygen precipitation heat-treatment, the wafer will have a substantially uniform concentration of interstitial oxygen from the center of the wafer to regions of the wafer which are within about 15 microns of the silicon surface, more preferably from the center of the silicon to regions of the wafer which are within about 10 microns of the silicon surface, even more preferably from the center of the silicon to regions of the wafer which are within about 5 microns of the silicon surface, and most preferably from the center of the silicon to regions of the wafer which are within about 3 microns of the silicon surface. In this context, a substantially uniform oxygen concentration shall mean a variance in the oxygen concentration of no more than about 50%, preferably no more than about 20%, and most preferably no more than about 10%.

Typically, oxygen precipitation heat-treatments do not result in a substantial amount of oxygen outdiffusion from the heat-treated wafer. As a result, the concentration of interstitial oxygen in the denuded zone at distances more than several microns from the wafer surface will not significantly change as a consequence of the precipitation heat-treatment. For example, if the denuded zone of the wafer consists of the region of the wafer between the surface of the silicon and a distance, D (which is at least about 10 micrometers) as measured from the front surface and toward the central plane, the oxygen concentration at a position within the denuded zone which is at a distance from the silicon surface equal to one-half of D will typically be at least about 75% of the peak concentration of the interstitial oxygen concentration anywhere in the denuded zone. For some oxygen precipitation heat-treatments, the interstitial oxygen concentration at this position will be even greater, i.e., at least 85%, 90% or even 95% of the maximum oxygen concentration anywhere in the denuded zone.

E. Epitaxial Layer

In one embodiment of the present invention, an epitaxial layer may be deposited upon the surface of an ideal precipitating wafer. The above-described oxygen precipitate nucleation and stabilization process of the present invention may be carried out either before or after the epitaxial deposition. Advantageously, the formation of stabilized oxygen precipitation nucleation centers allows for an epitaxial deposition process to be carried out without dissolving the installed precipitate profile.

The epitaxial layer will be formed by means conventionally known and used by those skilled in the art such as decomposition of a gas phase, silicon-containing composition. In a preferred embodiment of this invention, the surface of the wafer is exposed to an atmosphere comprising a volatile gas comprising silicon (e.g., $SiCl_4$, $SiHCl_3$, $SiH_2Cl_2$, $SiH_3Cl$ or $SiH_4$). The atmosphere also preferably contains a carrier gas (preferably $H_2$). In one embodiment, the source of silicon during the epitaxial deposition is $SiH_2Cl_2$ or $SiH_4$. If $SiH_2Cl_2$ is used, the reactor vacuum pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air or other gases leaking into the reactor chamber is lessened.

During the epitaxial deposition, the wafer surface is preferably maintained at a temperature sufficient to prevent the atmosphere comprising silicon from depositing polycrystalline silicon onto the surface a temperature of at least about 800° C., more preferably about 900° C., and most preferably about 1100° C. The rate of growth of the epitaxial deposition preferably is from about 0.5 to about 7.0 $\mu$m/min. A rate of from about 3.5 to 4.0 $\mu$m/min. may be achieved, for example, by using an atmosphere consisting essentially of about 2.5 mole % $SiHCl_3$ and about 97.5 mole % $H_2$ at a temperature of about 1150° C. and pressure of about 1 atm.

If desired, the epitaxial layer may additionally include a p-type or n-type dopant. For example, it is often preferable for the epitaxial layer to contain boron. Such a layer may be prepared by, for example, including $B_2H_6$ in the atmosphere during the deposition. The mole fraction of $B_2H_6$ in the atmosphere used to obtain the desired properties (e.g., resistivity) will depend on several factors, such as the amount of boron out-diffusion from the particular substrate during the epitaxial deposition, the quantity of p-type dopants and n-type dopants that are present in the reactor and substrate as contaminants, and the reactor pressure and temperature. For high resistivity applications, the dopant concentration in the epitaxial layer should be as low as practical.

F. Preparation of Silicon On Insulator Structures

The stabilization of oxygen precipitation nuclei by nitrogen/carbon doping in accordance with the present invention may also be used to prepare a silicon on insulator (SOI) structure as disclosed in U.S. Pat. No. 6,236,104, which is incorporated herein by reference. The SOI structure may be produced by subjecting the base, or handle, wafer to an ion implantation process which is standard in the art (see, e.g., U.S. Pat. No. 5,436,175). Preferably, the ideal precipitating wafer process is performed on the handle wafer prior to ion implantation which results in the oxide layer being located within the denuded zone.

Alternatively, the SOI structure may be produced by bonding a device layer wafer to a nitrogen/carbon doped stabilized handle wafer and then etching away a portion of the device layer wafer using wafer thinning techniques, also common in the art (see, e.g., U.S. Pat. No. 5,024,723). Preferably, the device layer wafer will be bound to the handle wafer after the nitrogen/carbon doped handle wafer has been subjected to the ideal precipitating wafer process. Alternatively, however, the device layer wafer may first be bound to a nitrogen/carbon doped handle wafer and the entire SOI structure may be subjected to the ideal precipitating wafer process.

In addition to the nitrogen/carbon stabilization, stabilization of the oxygen precipitate nucleation centers may be further enhanced by the thermal stabilization process disclosed in U.S. application Ser. No. 60/300,208 filed on Jun. 22, 2001, which is incorporated herein by reference.

G. Measurement of Crystal Lattice Vacancies

The measurement of crystal lattice vacancies in single crystal silicon can be carried out by platinum diffusion analysis. In general, platinum is deposited on the samples and diffused in a horizontal surface with the diffusion time and temperature preferably being selected such that the Frank-Turnbull mechanism dominates the platinum diffusion, but which is sufficient to reach the steady-state of vacancy decoration by platinum atoms. For wafers having vacancy concentrations which are typical for the present invention, a diffusion time and temperature of 730° C. for 20 minutes may be used, although more accurate tracking appears to be attainable at a lesser temperature, e.g., about 680° C. In addition, to minimize a possible influence by silicidation processes, the platinum deposition method preferably results in a surface concentration of less than one monolayer. Platinum diffusion techniques are described elsewhere, for example, by Jacob et al., *J. Appl. Phys.*, vol. 82, p. 182 (1997); Zimmermann and Ryssel, "The Modeling of Platinum Diffusion In Silicon Under Non-Equilibrium Conditions," *J. Electrochemical Society*, vol. 139, p. 256 (1992); Zimmermann, Goesele, Seilenthal and Eichiner, "Vacancy Concentration Wafer Mapping In Silicon," *Journal of Crystal Growth*, vol. 129, p. 582 (1993); Zimmermann and Falster, "Investigation Of The Nucleation of Oxygen Precipitates in Czochralski Silicon At An Early Stage," *Appl. Phys. Lett.*, vol. 60, p. 3250 (1992); and Zimmermann and Ryssel, *Appl. Phys. A*, vol. 55, p. 121 (1992).

It is to be understood that the above description is intended to be illustrative and not restrictive. Many embodiments will be apparent to those of skill in the art upon reading the above description. The scope of the invention should therefore be determined not with reference to the above description alone, but should also be determined with reference to the claims and the full scope of equivalents to which such claims are entitled.

We claim:

1. A single crystal silicon wafer having two major, generally parallel surfaces, one of which is the front surface of the wafer and the other of which is the back surface of the wafer, a central plane between the front and back surfaces, and a circumferential edge joining the front and back surfaces, the wafer comprising:

a dopant selected from a group consisting of nitrogen and carbon, the concentration of the dopant being sufficient to promote the formation of stabilized oxygen precipitate nucleation centers as the wafer is cooled from a first temperature, $T_1$, to a second temperature, $T_2$, at a rate, R, the stabilized oxygen precipitation nucleation centers being incapable of being dissolved at a temperature less than about 1150° C. but capable of being dissolved at a temperature between about 1150° C. and about 1300° C., wherein $T_1$ is between about 1150° C.

and about 1300° C., $T_2$ is a temperature at which crystal lattice vacancies are relatively immobile in silicon, and R is at least about 5° C. per second;

a surface layer which comprises the region of the wafer between the front surface and a distance, D, measured from the front surface and toward the central plane, wherein the surface layer is free of stabilized oxygen precipitate nucleation centers; and a bulk layer which comprises a second region of the wafer between the central plane and the surface layer, wherein the bulk layer comprises stabilized oxygen precipitate nucleation centers.

2. The wafer of claim 1 wherein the dopant is nitrogen and the concentration of the nitrogen is between about $1 \times 10^{12}$ and about $5 \times 10^{14}$ atoms/cm$^3$.

3. The wafer of claim 1 wherein the dopant is nitrogen and the concentration of nitrogen in the wafer is between about $1 \times 10^{12}$ and about $1 \times 10^{13}$ atoms/cm$^3$.

4. The wafer of claim 1 wherein the dopant is carbon and the concentration of carbon is between about $1 \times 10^{16}$ and about $4 \times 10^{17}$ atoms/cm$^3$.

5. The wafer of claim 1 wherein the dopant is carbon and the concentration of carbon in the wafer is between about $1.5 \times 10^{16}$ and about $3 \times 10^{17}$ atoms/cm$^3$.

6. The wafer of claim 1 wherein the stabilized oxygen precipitate nucleation centers in the bulk layer have a concentration profile in which the peak density is at or near the central plane and generally decreases in the direction of the front surface of the wafer.

7. The wafer of claim 1 wherein the stabilized oxygen precipitate nucleation centers in the bulk layer have a concentration profile in which the peak density at some point between about the central plane and the surface layer.

8. The wafer of claim 1 wherein D is at least about 10 micrometers.

9. The wafer of claim 1 wherein D is at least about 20 micrometers.

10. The wafer of claim 1 wherein D is at least about 50 micrometers.

11. The wafer of claim 1 wherein D is between about 30 and about 100 micrometers.

12. The wafer as set forth in claim 1 wherein the wafer comprises an epitaxial layer on at least one surface of the wafer.

13. The wafer as set forth in claim 1 wherein $T_1$ is at least about 1150° C.

14. The wafer as set forth in claim 1 wherein $T_1$ is between about 1200° C. and about 1300° C.

15. The wafer as set forth in claim 1 wherein R is at least about 10° C. per second.

16. The wafer as set forth in claim 1 wherein R is at least about 20° C. per second.

17. The wafer as set forth in claim 1 wherein R is at least about 50° C. per second.

18. A single crystal silicon wafer having two major, generally parallel surfaces, one of which is the front surface of the wafer and the other of which is the back surface of the wafer, a central plane between the front and back surfaces, and a circumferential edge joining the front and back surfaces, the wafer comprising:

a dopant selected from a group consisting of nitrogen and carbon, when nitrogen is the dopant, the concentration of the nitrogen being between about $1 \times 10^{12}$ and about $5 \times 10^{14}$ atoms/cm$^3$, and when carbon is the dopant, the concentration of carbon is between about $1 \times 10^{16}$ and about $4 \times 10^{17}$ atoms/cm$^3$;

a surface layer which comprises the region of the wafer between the front surface and a distance, D, measured from the front surface and toward the central plane, wherein the surface layer is free of stabilized oxygen precipitate nucleation centers; and a bulk layer which comprises a second region of the wafer between the central plane and the surface layer, wherein the bulk layer comprises stabilized oxygen precipitate nucleation centers.

19. A silicon on insulator structure comprising:

a single crystal silicon handle wafer comprising two major, generally parallel surfaces, one of which is the front surface of the wafer and the other of which is the back surface of the wafer, a central plane between the front and back surfaces, and a circumferential edge joining the front and back surfaces, a dopant selected from a group consisting of nitrogen and carbon, the concentration of the dopant being sufficient to promote the formation of stabilized oxygen precipitate nucleation centers as the wafer is cooled from a first temperature, $T_1$, to a second temperature, $T_2$, at a rate, R, the stabilized oxygen precipitation nucleation centers being incapable of being dissolved at a temperature less than about 1150° C. but capable of being dissolved at a temperature between about 1150° C. and about 1300° C., wherein $T_1$ is between about 1150° C. and about 1300° C., $T_2$ is a temperature at which crystal lattice vacancies are relatively immobile in silicon, and R is at least about 5° C. per second, a surface layer which comprises the region of the wafer between the front surface and a distance, D, measured from the front surface and toward the central plane, wherein the surface layer is free of stabilized oxygen precipitate nucleation centers, and a bulk layer which comprises a second region of the wafer between the central plane and the surface layer, wherein the bulk layer comprises stabilized oxygen precipitate nucleation centers;

a single crystal silicon device layer; and an insulating layer between the handle wafer and the device layer.

20. A process for the preparation of a single crystal silicon wafer having a controlled oxygen precipitation behavior, the process comprising the steps of:

selecting a wafer sliced from a single crystal silicon ingot grown by the Czochralski method comprising a front surface, a back surface, a central plane between the front and back surfaces, a front surface layer which comprises the region of the wafer between the front surface and a distance, D, measured from the front surface and toward the central plane, a bulk layer which comprises the region of the wafer between the central plane and the front surface layer, and a dopant selected from a group consisting of nitrogen and carbon, the concentration of the dopant being sufficient to promote the formation of stabilized oxygen precipitate nucleation centers as the wafer is cooled from a first temperature, $T_1$, to a second temperature, $T_2$, at a rate, R, the stabilized oxygen precipitation nucleation centers being incapable of being dissolved at a temperature less than about 1150° C. but capable of being dissolved at a temperature between about 1150° C. and about 1300° C., wherein $T_1$ is between about 1150° C. and about 1300° C., $T_2$ is a temperature at which crystal lattice vacancies are relatively immobile in silicon, and R is at least about 5° C. per second;

heating the wafer to a temperature of at least about 1150° C. to form crystal lattice vacancies in the front surface and bulk layers;

cooling the heated wafer at a rate to form a vacancy concentration profile in the wafer wherein the peak density of vacancies is in the bulk layer with the concentration generally decreasing from the location of the peak density in the direction of the front surface of the wafer and the difference in the concentration of vacancies in the front surface and bulk layers is such that stabilized oxygen precipitate nucleation centers do not form in the front surface layer and stabilized oxygen precipitate nucleation centers form in the bulk layer;

forming stabilized oxygen precipitate nucleation centers in the bulk layer as the wafer is being cooled with the concentration of the stabilized oxygen precipitate nucleation centers in the bulk layer being primarily dependant upon the concentration of vacancies.

21. The process of claim 20 wherein the dopant is nitrogen and the concentration of nitrogen in the wafer is between about $1 \times 10^{12}$ and about $5 \times 10^{14}$ atoms/cm$^3$.

22. The process of claim 20 wherein the dopant is nitrogen and the concentration of nitrogen in the wafer is between about $1 \times 10$ and about $1 \times 10^{13}$ atoms/cm$^3$.

23. The process of claim 20 wherein the dopant is carbon and the concentration of carbon in the wafer is between about $1 \times 10^{16}$ and about $4 \times 10^{17}$ atoms/cm$^3$.

24. The process of claim 20 wherein the dopant is carbon and the concentration of carbon in the wafer is between about $1.5 \times 10^{16}$ and about $3 \times 10^{17}$ atoms/cm$^3$.

25. The process of claim 20 wherein the wafer is heated to a temperature of at least about 1175° C.

26. The process of claim 20 wherein the wafer is heated to a temperature of at least about 1200° C.

27. The process of claim 20 wherein the wafer is heated to a temperature between about 1200° C. and about 1275° C.

28. The process of claim 20 wherein the wafer is exposed to an atmosphere while being heated, said atmosphere comprising one or more gases selected from a group consisting of argon, helium, neon, carbon dioxide, and nitrogen or a nitrogen-containing gas.

29. The process of claim 28 wherein the atmosphere argon.

30. The process of claim 28 wherein the atmosphere comprises nitrogen or a nitrogen-containing gas.

31. The process of claim 28 wherein the atmosphere comprises argon and nitrogen or a nitrogen-containing gas.

32. The process of claim 28 wherein the atmosphere comprises a partial pressure of oxygen that is no more than about 0.01 atmospheres.

33. The process of claim 28 wherein the atmosphere comprises a partial pressure of oxygen that is no more than about 0.005 atmospheres.

34. The process of claim 28 wherein the atmosphere comprises a partial pressure of oxygen that is no more than about 0.002 atmospheres.

35. The process of claim 28 wherein the atmosphere comprises a partial pressure of oxygen that is no more than about 0.001 atmospheres.

36. The process of claim 28 wherein the atmosphere comprises a partial pressure of oxygen that is between about 0.0001 and about 0.01 atmospheres.

37. The process of claim 28 wherein the atmosphere comprises a partial pressure of oxygen that is between about 0.0002 and about 0.001 atmospheres.

38. The process of claim 20 wherein the front surface of the wafer is exposed to a first atmosphere while being heated, said first atmosphere comprising one or more gases selected from a group consisting of argon, helium, neon, carbon dioxide, and nitrogen or a nitrogen-containing gas, and the back surface of the wafer is exposed to a second atmosphere while being heated, said second atmosphere comprising one or more gases selected from the group consisting of argon, helium, neon, carbon dioxide, and nitrogen or a nitrogen-containing gas, with the first and second atmospheres having at least one gas not in common.

39. The process of claim 20 wherein, prior to the heat-treatment to form crystal lattice vacancies, the wafer is heated to a temperature of at least about 700° C. in an oxygen-containing atmosphere to form a superficial silicon dioxide layer which is capable of serving as a sink for crystal lattice vacancies.

40. The process of claim 20 wherein the cooling rate is at least about 5° C. per second through the temperature range at which crystal lattice vacancies are relatively mobile in silicon.

41. The process of claim 20 wherein the cooling rate is at least about 20° C. per second through the temperature range at which crystal lattice vacancies are relatively mobile in silicon.

42. The process of claim 20 wherein the cooling rate is at least about 50° C. per second through the temperature range at which crystal lattice vacancies are relatively mobile in silicon.

43. The process of claim 20 wherein the cooling rate is at least about 100° C. per second through the temperature range at which crystal lattice vacancies are relatively mobile in silicon.

44. The process of claim 20 comprising depositing an epitaxial layer on at least one surface of the wafer after formation of the stabilized oxygen precipitate nucleation centers form in the bulk layer.

45. A process for the preparation of a single crystal silicon wafer having a controlled oxygen precipitation behavior, the process comprising:

selecting a wafer sliced from a single crystal silicon ingot grown by the Czochralski method comprising a front surface, a back surface, a central plane between the front and back surfaces, a front surface layer which comprises the region of the wafer between the front surface and a distance, D, measured from the front surface and toward the central plane, a bulk layer which comprises the region of the wafer between the central plane and the front surface layer, and a dopant selected from the group consisting of nitrogen and carbon, when the nitrogen is the dopant, the concentration of the nitrogen is between about $1 \times 10^{12}$ and about $5 \times 10^{14}$ atoms/cm$^3$, and when the carbon is the dopant, the concentration of carbon is between about $1 \times 10^{16}$ and about $4 \times 10^{17}$ atoms/cm$^3$;

subjecting the wafer to a heat-treatment to form crystal lattice vacancies in the front surface and bulk layers;

cooling the heat-treated wafer at a rate that produces a vacancy concentration profile in the wafer wherein the peak density of vacancies is in the bulk layer with the concentration generally decreasing from the location of the peak density in the direction of the front surface of the wafer and the difference in the concentration of vacancies in the front surface and bulk layers is such that stabilized oxygen precipitate nucleation centers do not form in the front surface layer and stabilized oxygen precipitate nucleation centers form in the bulk layer; and forming stabilized oxygen precipitate nucleation centers in the bulk layer as the heat-treated wafer is being cooled with the concentration of the stabilized oxygen precipitate nucleation centers in the bulk layer being primarily dependant upon the concentration of vacancies.

46. The wafer of claim 1 wherein the wafer is selected from the group consisting of a polished silicon wafer, and a silicon wafer which has been lapped and etched but not polished.

47. The wafer of claim 1 wherein the surface layer which comprises the region of the wafer between the front surface and the distance D measured from the front surface and toward the central plane is a layer distinct from any epitaxial layer.

48. The wafer of claim 1 wherein the region of the wafer which the surface layer comprises is a region of a wafer sliced from an ingot grown in accordance with a conventional Czochralski crystal growing method.

* * * * *

UNITED STATES PATENT AND TRADEMARK OFFICE
CERTIFICATE OF CORRECTION

PATENT NO. : 6,808,781 B2
DATED : October 26, 2004
INVENTOR(S) : Luciano Mule'Stagno et al.

It is certified that error appears in the above-identified patent and that said Letters Patent is hereby corrected as shown below:

Column 19,
Line 22, "1x10and" should read -- $1x10^{12}$ and --.
Lines 40-41, "the atmosphere argon" should read -- the atmosphere comprises argon --.

Signed and Sealed this

Twenty-second Day of November, 2005

JON W. DUDAS
*Director of the United States Patent and Trademark Office*